United States Patent
Boyce

(10) Patent No.: US 8,046,667 B2
(45) Date of Patent: Oct. 25, 2011

(54) SYNCHRONIZATION LOSS RESILIENT DIGITAL COMMUNICATION SYSTEM USING FORWARD ERASURE CORRECTION

(75) Inventor: Jill MacDonald Boyce, Manalapan, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 964 days.

(21) Appl. No.: 10/511,638

(22) PCT Filed: Apr. 17, 2003

(86) PCT No.: PCT/US03/11969
§ 371 (c)(1),
(2), (4) Date: Oct. 18, 2004

(87) PCT Pub. No.: WO03/090360
PCT Pub. Date: Oct. 30, 2003

(65) Prior Publication Data
US 2005/0213499 A1    Sep. 29, 2005

Related U.S. Application Data

(60) Provisional application No. 60/374,054, filed on Apr. 19, 2002.

(51) Int. Cl.
*H03M 13/00* (2006.01)
(52) U.S. Cl. ........................................ 714/775; 370/456
(58) Field of Classification Search ................... 714/775; 370/456
See application file for complete search history.

(56) References Cited

U.S. PATENT DOCUMENTS

| | | | |
|---|---|---|---|
| 5,220,568 A * | 6/1993 | Howe et al. | 714/782 |
| 5,608,738 A | 3/1997 | Matsushita | |
| 5,841,987 A * | 11/1998 | Blatter et al. | 709/236 |
| 6,009,549 A * | 12/1999 | Bliss et al. | 714/769 |
| 6,067,563 A * | 5/2000 | Thomas et al. | 709/212 |
| 6,145,109 A * | 11/2000 | Schuster et al. | 714/752 |
| 6,163,870 A | 12/2000 | Luby et al. | |
| 6,195,777 B1 | 2/2001 | Luby et al. | |
| 6,421,387 B1 * | 7/2002 | Rhee | 375/240.27 |
| 6,735,734 B1 * | 5/2004 | Liebetreu et al. | 714/775 |
| 2003/0005387 A1 | 1/2003 | Tsunoda | |

FOREIGN PATENT DOCUMENTS

| | | |
|---|---|---|
| EP | 0996291 A1 | 4/2000 |
| JP | 5114891 | 5/1993 |
| JP | 07-135494 | 5/1995 |
| JP | 10070150 | 3/1998 |
| JP | 10091214 | 4/1998 |
| JP | 10107766 | 4/1998 |

(Continued)

OTHER PUBLICATIONS

Search Report Dated Jul. 14, 2003.

(Continued)

*Primary Examiner* — Scott T Baderman
*Assistant Examiner* — Enam Ahmed
(74) *Attorney, Agent, or Firm* — Robert D. Shedd; Jeffrey M. Navon

(57) ABSTRACT

There is provided an apparatus for enabling recovery of missing information in a digital communication system. The apparatus includes a Forward Erasure Correction (FXC) encoder for computing FXC parity superpackets across information superpackets for subsequent recovery of any entire ones of the information superpackets that have been at least partially comprised due to synchronization loss.

17 Claims, 3 Drawing Sheets

FOREIGN PATENT DOCUMENTS

| | | |
|---|---|---|
| JP | 11-136220 A1 | 5/1999 |
| JP | 2001203749 | 7/2001 |
| WO | WO0154116 | 7/2001 |
| WO | WO01/74012 A1 | 10/2001 |

OTHER PUBLICATIONS

Komura, Takaaki, et. al., "Forward Error Correction for QoS-Reserved Internet Broadcasting", Nov. 10, 2000, Information Processing Society of Japan, vol. 2000 No. 102 IPSJ Sig Notes.

Supplemental European Search Report Appl No. 03719826 dated Jun. 26, 2008.

Frossard et al.:"Joint Source/FEC Rate Selection for Quality-Optimal MPEG-2 Video Delivery", IEEE Transactions on image Processing, vol. 10, No. 12, Dec. 2001, p. 1815.

Carle et al.: RTMC: An Error Control Protocol for IP-based Audio-Visual Multicast Application, IEEE, pag 566, XP002128250.

Chou et al.:"Error Control Receiver-Driven Layered multicast of Audio and Video", IEEE Transactions on Multimedia, vol. 3, No. 1, Mar. 2001, p. 108.

"RF/Transmission System Characteristics", ATSC Digital Television Standard (Annex D), p. 46, XP002208500.

Hoffman et al., "RTP Payload Format for MPEG1/MPEG2 Video", Internet Engineering Task Force, Internet-Draft, draft-ietf-avt-mpeg-new-01.txt, Dec. 1997.

* cited by examiner

SYNCHRONIZATION LOSS RESILIENT DIGITAL COMMUNICATION SYSTEM USING FORWARD ERASURE CORRECTION

This application claims the benefit, under 35 U.S.C. §365 of International Application PCT/US03/11969, filed Apr. 17, 2003, which was published in accordance with PCT Article 21(2) on Oct. 30, 2003 in English and which claims the benefit of U.S. Provisional Patent Application No. 60/374,054 filed Apr. 19, 2002.

CROSS-REFERENCE TO RELATED APPLICATIONS

This is a non-provisional application claiming the benefit under 35 U.S.C. §119 of provisional application Ser. No. 60/374,054 entitled "SYNCHRONIZATION LOSS RESILIENT DIGITAL COMMUNICATION SYSTEM USING FORWARD ERASURE CORRECTION", filed on 19 Apr. 2002, which is incorporated by reference herein.

BACKGROUND OF THE INVENTION

1. Field of the Invention

The present invention generally relates to communication systems and, more particularly, to a synchronization loss resilient digital communication system using Forward Erasure Correction (FXC).

2. Background of the Invention

Wireless digital communications systems are subject to multi-path and fades, which can lead to loss of synchronization. The data transmitted during periods of lost synchronization are normally lost to the receiver. Thus, the problem to be solved is how to design a wireless digital communication system that is resilient to synchronization loss due to multi-path and fading, with as low an overhead rate as possible.

The effects of multi-path and fading effects on Wireless digital communication links are well understood and their probability characteristics have been documented. For example, in Advanced Television Systems Committee (ATSC) 8 Vestigial Side Band (8VSB) transmission systems for High Definition Television (HDTV) broadcast in the United States, the probability distribution of fade duration has been studied. Reception of the 8VSB system on a mobile device further increases the probability of synchronization loss. Even after synchronization is reacquired, useful data cannot be recovered in an ATSC 8VSB system until trellis decoding is re-trained, and an interleaver begins a new block.

The ATSC 8VSB system includes several types of channel coding to protect against noisy transmission, including trellis coding, interleaving, and Reed Solomon (RS) Forward Error Correction (FEC). But when synchronization loss occurs, the channel coding methods used do not assist in recovering the data.

Repeatedly transmitting data can improve system resiliency synchronization loss, but at the cost of high overhead. Allocating more of the available bandwidth to repeated transmission of data reduces the amount of original data that can be transmitted, which means fewer programs, or lower quality of transmitted programs.

It has also been proposed that instead of repeatedly transmitting the original data, the overhead rate could be reduced by redundantly transmitting a lower bit-rate version of the original data. When the original data is lost due to synchronization loss, the reduced resolution version is used by the receiver. This allows graceful degradation, i.e., a lower quality version of the original data is available rather than the original data. However, if the original higher resolution data is required, the reduced resolution version may prove unsatisfactory.

Accordingly, it would be desirable and highly advantageous to have a synchronization loss resilient digital communications system that overcomes the above stated problems of the prior art.

SUMMARY OF THE INVENTION

The problems stated above, as well as other related problems of the prior art, are solved by the present invention, a synchronization loss resilient digital communication system using Forward Erasure Correction (FXC).

According to an aspect of the present invention, there is provided an apparatus for enabling recovery of missing information in a digital communication system. The apparatus includes a Forward Erasure Correction (FXC) encoder for computing FXC parity superpackets across information superpackets for subsequent recovery of any entire ones of the information superpackets that have been at least partially compromised due to synchronization loss.

According to another aspect of the present invention, there is provided an apparatus for recovering missing information in a digital communication system. The apparatus includes a Forward Erasure Correction (FXC) decoder for decoding FXC parity superpackets previously computed across information superpackets to recover any entire ones of the information superpackets that have been at least partially compromised due to synchronization loss.

According to yet another aspect of the present invention, there is provided a method for enabling recovery of missing information in a digital communication system. The method includes the step of computing FXC parity superpackets across information superpackets for subsequent recovery of any entire ones of the information superpackets that have been at least partially compromised due to synchronization loss.

According to still yet another aspect of the present invention, there is provided a method for recovering missing information in a digital communication system. The method includes the step of decoding FXC parity superpackets previously computed across information superpackets to recover any entire ones of the information superpackets that have been at least partially compromised due to synchronization loss.

These and other aspects, features and advantages of the present invention will become apparent from the following detailed description of preferred embodiments, which is to be read in connection with the accompanying drawings.

DETAILED DESCRIPTION OF THE INVENTION

Figure 1:
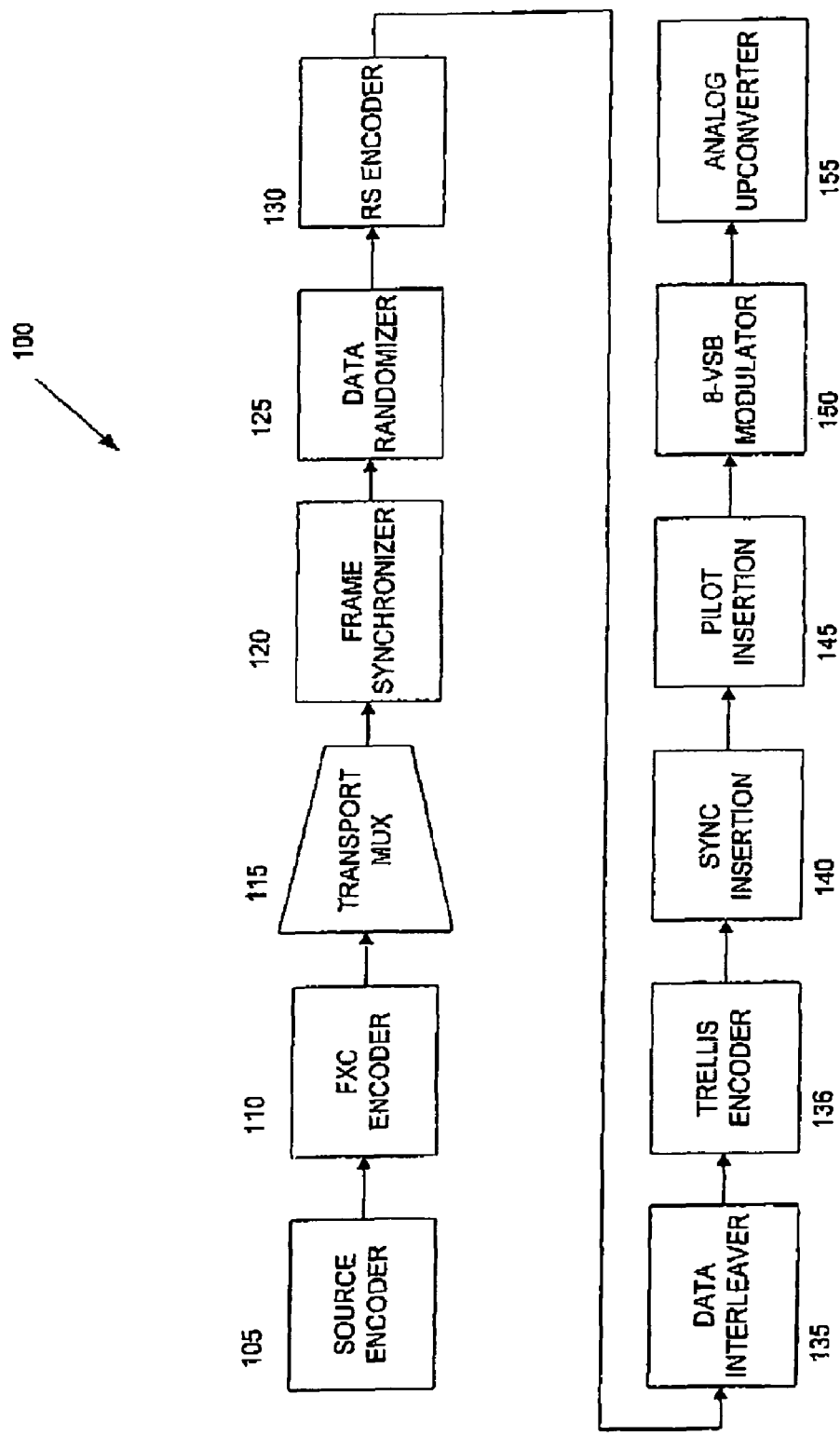
FIG. 1 is a schematic diagram illustrating a Vestigial Side Band (VSB) transmitter, according to an illustrative embodiment of the present invention.

The present invention is directed to a synchronization loss resilient digital communication system using Forward Erasure Correction (FXC). The present invention employs Forward Erasure Correction (FXC) codes to recover from synchronization loss, by treating periods of sync loss as packet erasures. Additional parity data to recover from those packet erasures is transmitted in a backwards-compatible manner. This allows a reduction in the overhead rate, as compared to repeatedly transmitting data.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Forward Erasure Correction (FXC) codes are applied to the transmission of packet data to protect against packet loss in transmissions of data over packet networks, such as those using Internet Protocol (IP). Any type of FXC codes may be used including, but not limited to, for example, Reed Solomon (RS) codes. Reed Solomon codes are systematic codes, i.e., the original information bytes are transmitted as well as additional parity bytes. In the absence of channel loss, the receiver can merely use the received original information bytes, and does not need to do any FXC decoding. Packet networks tend to lose entire packets of data, rather than individual bytes in the packets. When FXC is used to protect against packet loss, typically (but not necessarily) one byte from each packet is used to form a FXC codeword. For example, if 10 packets of length 1024 bytes were coded using FXC, using RS (15, 10) codes, 10 information packets of length 1024 and 5 parity packets of length 1024 would be transmitted. Thus, 1024 different RS codewords would be formed by taking one byte from each packet.

Thus, protection against data loss due to synchronization loss in a digital communications system is achieved by adding a layer of Forward Erasure Correction (FXC), with the parity data computed over time periods corresponding to the expected length of the synchronization loss periods. Periods of data loss due to synchronization failure are considered to be packet erasures in the FXC decoder. Because the term packet is generally used to refer to a smaller time scale in this system (such as, e.g., an MPEG-2 transport packet of 188 bytes), as used herein the term "superpacket" will be used to refer to a packet unit employed in or capable of being employed in the FXC decoder.

It is to be appreciated that the present invention is independent of the type of data that is being transmitted and, thus, can be used for the transmission of any type of data. It is to be further appreciated that the present invention is not limited to audio/video programs and, thus, can be used for any type of program.

According to the present invention, FXC is used in addition to other channel coding methods in the digital communications system that protect against impulse noise. For example, in the ATSC 8VSB system, FXC coding is added to the system's trellis coding, interleaving and Reed Solomon (RS) Forward Error Correction (FEC) coding. The FXC used can be any systematic forward erasure correction code including, but not limited to, for example, Reed Solomon (RS) codes. When a systematic code is used, the present invention can be backwards compatible. That is, an existing decoder can ignore the additional parity superpackets transmitted and decode the unchanged information superpackets normally. The FXC encoder and decoder differ from any RS FEC codes already used in an existing digital communications system. For example, the FXC codewords are computed across superpackets (e.g., at one byte per superpacket) and protect against loss (erasure) of entire superpackets. In contrast, the existing RS FEC protects against random bit or byte errors, not erasures, inside a given packet, with the samples taken from nearby points in time.

In a preferred embodiment of the present invention, the FXC parameters n and k, and the superpacket length s, are selected based on desired loss protection level and allowable delay. The parameter n denotes the block length of an FXC codeword. The parameter k denotes the number of information symbols in an FXC codeword. It is to be appreciated that the phrases "FXC codewords" and "FXC parity superpackets" are used interchangeably herein, and are to be contrasted to "information superpackets" which are the data elements from which the FXC parity superpackets are computed.

The expected length of lost synchronization should be equal to or less than: $s*(n/k)*h$, (where $h=n-k$). The overhead rate for the FXC encoding is h/k. So, for example, in a system that broadcasts 19.2 Mbps (i.e., 2.4 M Bytes/sec), to protect against a fade of 500 msec, $s*(n/k)*h<=1.2M$ Bytes. If, for example, n=6 and k=4 (and, thus, h=2), then the overhead rate is 50%, and s=400 Kbytes. Additional storage may be required for the present invention, beyond what a standard ATSC 8VSB system would require, of s*n bytes, which for this example is 2.4 M Bytes. If multiple programs share the 19.2 Mbps channel bandwidth, storage requirements could be reduced by performing the FXC decoding only for the program being decoded.

FIG. 1 is a schematic diagram illustrating a Vestigial Side Band (VSB) transmitter 100, according to an illustrative embodiment of the present invention. It is to be appreciated that while an exemplary transmitter configuration has been described and shown herein for illustrative purposes with respect to FIG. 1, the present invention may readily be applied to other transmitter configurations capable of VSB signal transmission while maintaining the spirit and scope of the present invention.

The transmitter 100 includes 1 source encoder 105, an FXC encoder 110, a transport MUX 115, a frame synchronizer 120, a data randomizer 125, a Reed Solomon (RS) encoder 130, a data interleaver 135, a SYNC insertion module 140, a pilot insertion module 145, an 8-VSB modulator 150, and an analog up-converter 155.

The compressed bit stream from the source encoder 105 is processed by the FXC encoder 110, which adds redundancy by creating parity superpackets. The inputs from various sources are combined by the transport MUX 115 into a composite stream that is fed to the frame sychronizer 120. Data frames are created and delineated by the frame synchronizer 120. Each data frame includes two fields. Each data field has 313 data segments in the ATSC standard including a frame-synchronizing segment. Each data segment carries a 188-byte transport packet and associated Forward Error Correction (FEC) overhead. The data randomizer 125 is used on all input data to randomize only the data payload (not including the overhead and synchronizing elements). The Reed Solomon (RS) encoder 130 is a block encoder that takes in 187 bytes and adds 20 parity bytes for outer forward error correction at the receiver. The byte data is interleaved by the data interleaver 135, which uses a convolutional interleaver operating over 52 data segments (about a sixth of a field deep). A two-thirds rate, 4-state trellis-encoding scheme with one un-encoded bit that is pre-coded, is implemented by the trellis encoder 136. A data segment sync is inserted into every data segment and a data field sync is inserted into every data field, by the sync insertion module 140. These elements are not Reed Solomon or trellis encoded. A pilot signal is introduced by adding a Direct Current (DC) component to every symbol, by the pilot insertion module 145. Following this, the 8-VSB modulator 150 maps the symbols (generated at 10.76 Msymbols/sec) onto a 8-VSB constellation and generates a root Nyquist pulse corresponding to each symbol. The analog upconverter 155 then converts the signal to the desired carrier frequency for transmission.

The FXC encoder 110 is placed after the source encoder 105, but before the transport MUX 115 and channel coding blocks (e.g., RS encoder 130). k superpackets, each of length s, are input to an FXC encoder 110. The FXC encoder 110 generates h=n−k parity superpackets of length s. The original information superpackets and the parity superpackets are then multiplexed, using the transport MUX 115. The ATSC 8VSB system uses MPEG-2 Transport Streams in the transport MUX 115, which allows multiple programs to be multiplexed and sent over the same channel, with each program assigned a different Process IDentifier (PID). According to the present invention, the information superpackets are unchanged from a system that does not use FXC. According to the present invention, additional parity superpackets are transmitted that are assigned different PIDs by the transport MUX 115 than the information superpackets. If multiple programs are to be transmitted, each with a different PID, then the parity superpackets can be either be computed based on all programs together, or based on one or more individual programs. All data is then sent to the remaining channel coding portions of the ATSC 8VSB, which need not be changed from a standard system. To assist in synchronization at the receiver, special FXC Sync Transport Packets can be sent under a different PID, once for each n superpackets. These FXC Sync Transport Packets would indicate the correspondence between superpacket sequence number start positions with MPEG-2 Transport Packet PID and program_clock_reference (PCR) and continuity_counter fields, superpacket length, s, and the Reed Solomon (n, k) parameters.

Figure 2:
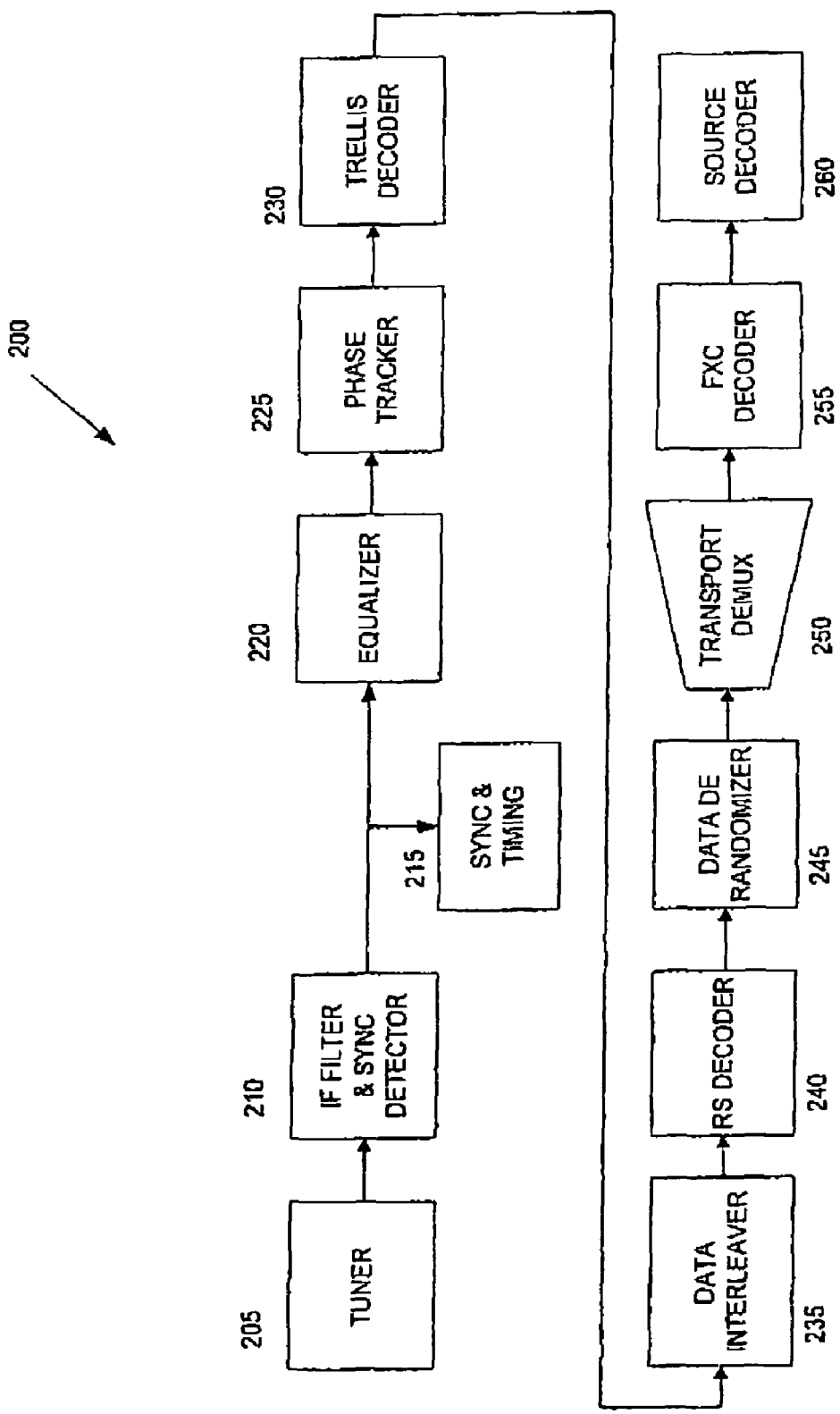
FIG. 2 is a schematic diagram illustrating a Vestigial Side Band (VSB) receiver, according to an illustrative embodiment of the present invention.

FIG. 2 is a schematic diagram illustrating a Vestigial Side Band (VSB) receiver 200, according to an illustrative embodiment of the present invention. It is to be appreciated that while an exemplary receiver configuration has been described and shown herein for illustrative purposes with respect to FIG. 2, the present invention may readily be applied to other receiver configurations capable of VSB signal reception while maintaining the spirit and scope of the present invention.

The receiver 200 includes a tuner 205, an Intermediate Frequency (IF) Filter and SYNC Detector 210, a SYNC and timing module 215, an equalizer 220, a phase tracker 225, a trellis decoder 230, a data interleaver 235, a Reed Solomon (RS) decoder 240, a data de-randomizer 245, a transport DEMUX 250, an FXC decoder 260, and a source decoder 265.

In an 8-VSB transmitted signal, digital information is transmitted exclusively in the amplitude of the RF envelope and not in the phase. The eight levels of the transmitted signal are recovered by sampling only the I-channel or in-phase information. Since any dependence on the Q-channel is eliminated, the receiver 200 has only to process the I-channel, thereby cutting in half the number of digital signal processing circuits required in the different stages of the receiver 200. It is clear that this results in greater simplicity and cost savings in the receiver design.

Signals are demodulated in the receiver 200 by applying the reverse principles that were applied in the transmitter 100 of FIG. 1. That is, incoming VSB signals are received, down-converted, filtered, and then detected. The segment synchronization and the frame synchronization are then recovered. An incoming signal is converted to an intermediate frequency by the tuner 205. Channel selectivity is performed by the IF filter and SYNC detector 210. Timing recovery and coarse carrier recovery are then accomplished by the SYNC and timing module 215. The signal is then equalized at the equalizer 220 to remove all multipath components. One of the advantages of the VSB system is that complex equalization is not necessary since the equalizer operates only on the I-channel or real information. The output of the equalizer 220 is applied to a phase tracker 225 to remove the residual phase jitter. The output of the phase tracker 225 is applied to a trellis-decoder 230 that corresponds to the inner code of the concatenated Forward Error Correction (FEC) system. The output of the trellis decoder 230 is applied to a data de-interleaver 235 that spreads burst errors induced by the trellis decoder. The de-interleaved data is then applied to a block-based Reed Solomon (RS) decoder 240 that corresponds to the outer code in the concatenated coding system. The output of the RS decoder 240, i.e., the channel decoded data, is then processed by the data de-randomizer 245, which corresponds to the inverse process at the transmitter. The de-randomized data is then fed to the transport de-multiplexer 250 which separates the composite stream into component streams for processing respectively by an audio source decoder, a video source decoder, and data source decoder (collectively represented by source decoder 260).

The FXC decoder 255 is placed after the other channel decoding blocks (e.g., RS decoder 240) and the transport DEMUX 250, and before the source decoder 260. Superpacket sequence numbers and positions can be determined using the FXC Sync Transport Packets. Erasure positions can be made available to the FXC decoder 255 using an error indication signal from one of the prior channel coding blocks, such as the RS decoder 240. For use in an MPEG-2 Transport Stream system, the transport_error_indicator field in the transport packet can be used to indicate the location of errors.

If no synchronization loss occurs, FXC decoding is not necessary, and the FXC decoder 255 just passes through the data in the information superpackets to the source decoder 260. If synchronization loss occurs, and is detected, those superpackets with missing or corrupted data are marked as erasures. If k or more superpackets are received correctly, whether information or parity superpackets, the FXC decoder 255 perfectly reconstructs the missing information packets, by performing decoding of s RS(n, k) codewords, taking one byte from each superpacket to form the codewords. Of course, more than one byte may be taken from each superpacket to form the codewords. That is, given the teachings of the present invention provided herein, one of ordinary skill in the related art will contemplate these and various other data units for use in forming codewords from superpackets.

Figure 3:
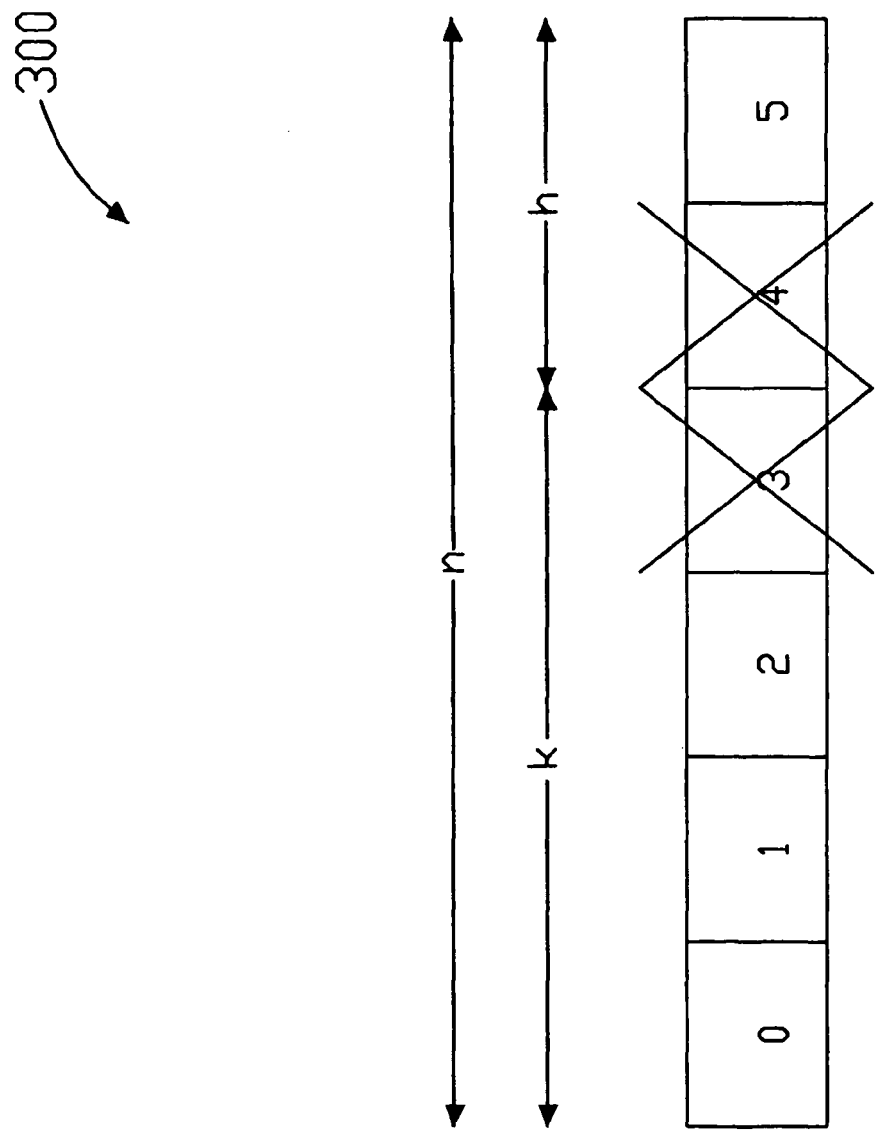
FIG. 3 is a diagram illustrating an example pattern of superpacket loss, according to an illustrative embodiment of the present invention.

For example, in a system with FXC RS(6,4), 6 superpackets of length 400 Kbytes are transmitted. Superpackets 0-3 are information superpackets, and superpackets 4 and 5 are parity superpackets. Superpackets 3 and 4 are corrupted at the receiver due to synchronization loss. FXC decoding is performed on 400 thousand codewords, each formed by taking the ith byte of superpackets 0, 1, 2, and 5, with the 3rd and 4th positions marked as erasures. Superpacket 3 is perfectly reconstructed by the FXC decoder 255, and superpackets 0-3 are sent onto the source decoder 260. An illustration of this example is provided in FIG. 3, which is a diagram illustrating an example pattern 300 of superpacket loss, according to an illustrative embodiment of the present invention.

It is to be appreciated that while the present invention has been described with respect to the Advanced Television Systems Committee (ATSC) 8VSB digital communications system, the present invention may be employed with any packet-based digital communications system.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

The invention claimed is:

1. An apparatus for enabling recovery of missing information in a digital communication system, comprising:
   a Forward Erasure Correction (FXC) encoder for computing FXC parity superpackets across information superpackets for subsequent recovery of any entire ones of the information superpackets that have been at least partially compromised due to synchronization loss; and
   a multiplexer for multiplexing the information superpackets and the FXC parity superpackets prior to any transmission thereof.

2. The apparatus of claim 1, wherein the FXC encoder computes the FXC parity superpackets across the information superpackets at one byte per each of the information superpackets.

3. The apparatus of claim 1, wherein for k information superpackets, each of length s, said FXC encoder computes h FXC parity superpackets of the length s, where h=n−k, n=a block length of each of the FXC parity superpackets, and k=a number of information symbols in each of the FXC parity superpackets.

4. The apparatus of claim 1, wherein the multiplexer assigns different Process IDentifiers (PIDs) to the FXC parity superpackets than the information superpackets.

5. The apparatus of claim 1, wherein the FXC encoder computes the FXC parity superpackets using Reed Solomon (RS) codes.

6. The apparatus of claim 1, wherein the multiplexer generates FXC sync transport packets that indicate a correspondence between superpacket sequence number start positions.

7. The apparatus of claim 1, wherein the FXC parity superpackets are computed over time periods corresponding to an expected length of at least one synchronization loss period.

8. An apparatus for recovering missing information in a digital communication system, comprising:
   a Forward Erasure Correction (FXC) decoder for decoding FXC parity superpackets previously computed across information superpackets to recover any entire ones of the information superpackets that have been at least partially compromised due to synchronization loss;
   wherein said FXC decoder further decodes FXC sync transport packets to determine superpacket sequence numbers and superpacket positions for both the FXC parity superpackets and the information superpackets.

9. The apparatus of claim 8, wherein said FXC decoder is adapted to receive an error signal that indicates an erasure position corresponding to the information superpackets that have been at least partially compromised due to the synchronization loss.

10. A method for enabling recovery of missing information in a digital communication system, comprising:
    computing FXC parity superpackets across information superpackets for subsequent recovery of any entire ones of the information superpackets that have been at least partially compromised due to synchronization loss; and
    multiplexing the information superpackets and the FXC parity superpackets prior to any transmission thereof.

11. The method of claim 10, wherein said computing step comprises the step of computing the FXC parity superpackets across the information superpackets at one byte per each of the information superpackets.

12. The method of claim 10, wherein for k information superpackets, each of length s, said computing step comprises the step of computing h FXC parity superpackets of the length s, where h=n−k, n=a block length of each of the FXC parity superpackets, and k=a number of information symbols in each of the FXC parity superpackets.

13. The method of claim 10, wherein said multiplexing step further comprises the step of assigning different Process IDentifiers (PIDs) to the FXC parity superpackets than the information superpackets.

14. The method of claim 10, wherein said computing step computes the FXC parity superpackets using Reed Solomon (RS) codes.

15. The method of claim 10, further comprising the step of generating FXC sync transport packets that indicate a correspondence between superpacket sequence number start positions.

16. The method of claim 10, wherein said computing step computes the FXC parity superpackets over time periods corresponding to an expected length of at least one synchronization loss period.

17. A method for recovering missing information in a digital communication system, comprising:
    decoding FXC parity superpackets previously computed across information superpackets to recover any entire ones of the information superpackets that have been at least partially compromised due to synchronization loss; and
    decoding FXC sync transport packets to determine superpacket sequence numbers and superpacket positions for both the FXC parity superpackets and the information superpackets.

* * * * *